(12) United States Patent
Chao et al.

(10) Patent No.: US 12,205,822 B2
(45) Date of Patent: Jan. 21, 2025

(54) NANOSTRUCTURE AND MANUFACTURING METHOD THEREOF

(71) Applicant: Taiwan Semiconductor Manufacturing Company, Ltd., Hsinchu (TW)

(72) Inventors: Chia-Cheng Chao, Hsinchu (TW); Hsin-Chieh Huang, Taoyuan (TW); Yu-Wen Wang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 607 days.

(21) Appl. No.: 17/450,123

(22) Filed: Oct. 6, 2021

(65) Prior Publication Data

US 2022/0319859 A1 Oct. 6, 2022

Related U.S. Application Data

(60) Provisional application No. 63/168,787, filed on Mar. 31, 2021.

(51) Int. Cl.
*H01L 21/306* (2006.01)
*H01L 21/3105* (2006.01)
*H01L 21/311* (2006.01)
*H01L 29/06* (2006.01)
*H01L 29/423* (2006.01)

(52) U.S. Cl.
CPC .. *H01L 21/30604* (2013.01); *H01L 21/31053* (2013.01); *H01L 21/31144* (2013.01); *H01L 29/0665* (2013.01); *H01L 29/0673* (2013.01); *H01L 29/42392* (2013.01)

(58) Field of Classification Search
None
See application file for complete search history.

(56) References Cited

U.S. PATENT DOCUMENTS

2010/0207208 A1* 8/2010 Bedell ............... H01L 29/66772
257/E21.409
2022/0285346 A1* 9/2022 Li ................... H01L 21/823807

\* cited by examiner

*Primary Examiner* — Feifei Yeung Lopez
(74) *Attorney, Agent, or Firm* — Harrity & Harrity, LLP

(57) ABSTRACT

Implementations described herein provide a method of forming a semiconductor device. The method includes forming a nanostructure having a first set of layers of a first material and a second set of layers, alternating with the first set of layers, having a second material. The method further includes depositing a hard mask on a top layer of the first set of layers, the hard mask including a first hard mask layer on the top layer of the first set of layers and a second hard mask layer on the first hard mask layer. The method also includes depositing elements of a cladding structure on sidewalls of the nanostructure and the hard mask. The method further includes removing a top portion of the cladding structure. The method further includes removing the second hard mask layer after removing the top portion of the cladding structure.

20 Claims, 16 Drawing Sheets

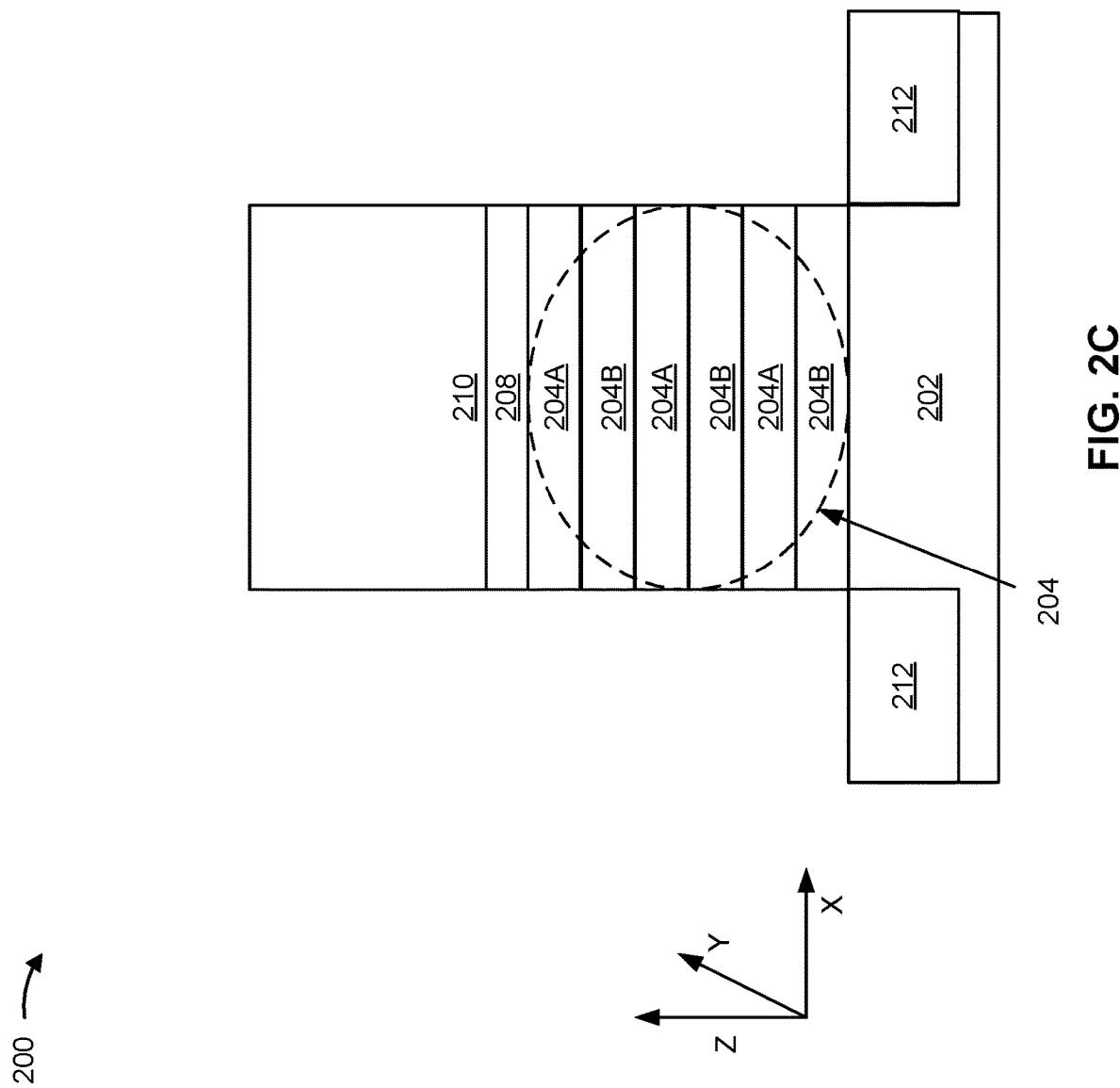

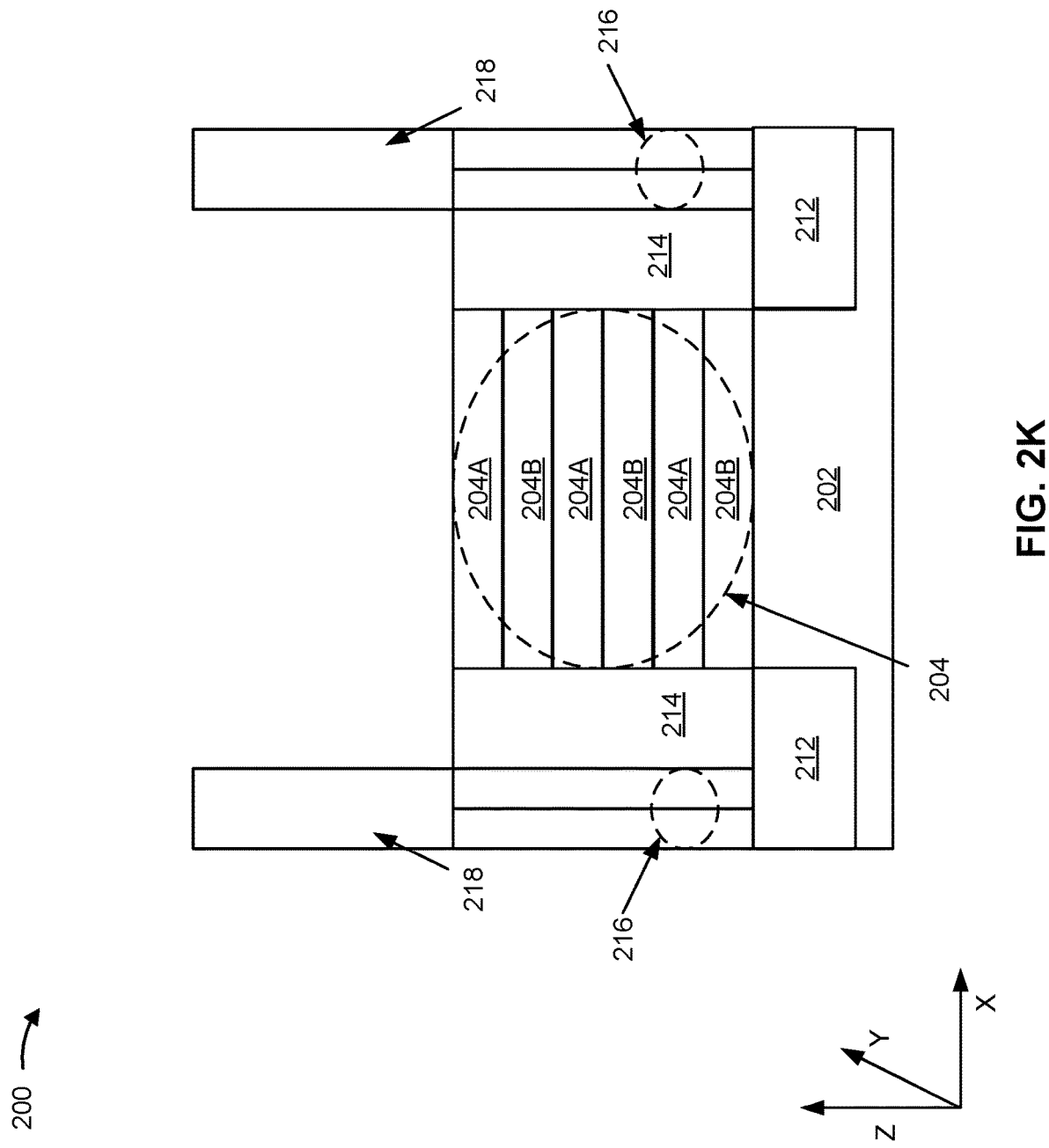

NANOSTRUCTURE AND MANUFACTURING METHOD THEREOF

CROSS-REFERENCE TO RELATED APPLICATION

This patent application claims priority to U.S. Provisional Patent Application No. 63/168,787, filed on Mar. 31, 2021, and entitled "SILICON FACET ETCHING." The disclosure of the prior application is considered part of and is incorporated by reference into this patent application.

BACKGROUND

A gate-all-around (GAA) field effect transistor (FET) is a transistor in which a gate structure (e.g., a GAA structure) surrounds multiple sides of a current channel to influence a current flow from every direction, and reduces short channel effects (SCE). Instead of providing a fin in a GAA FET, the current channel takes the form of one or more silicon nanowires coupling the source and drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2K are diagrams of an example implementation of forming a semiconductor device described herein.

DETAILED DESCRIPTION

Figure 1:
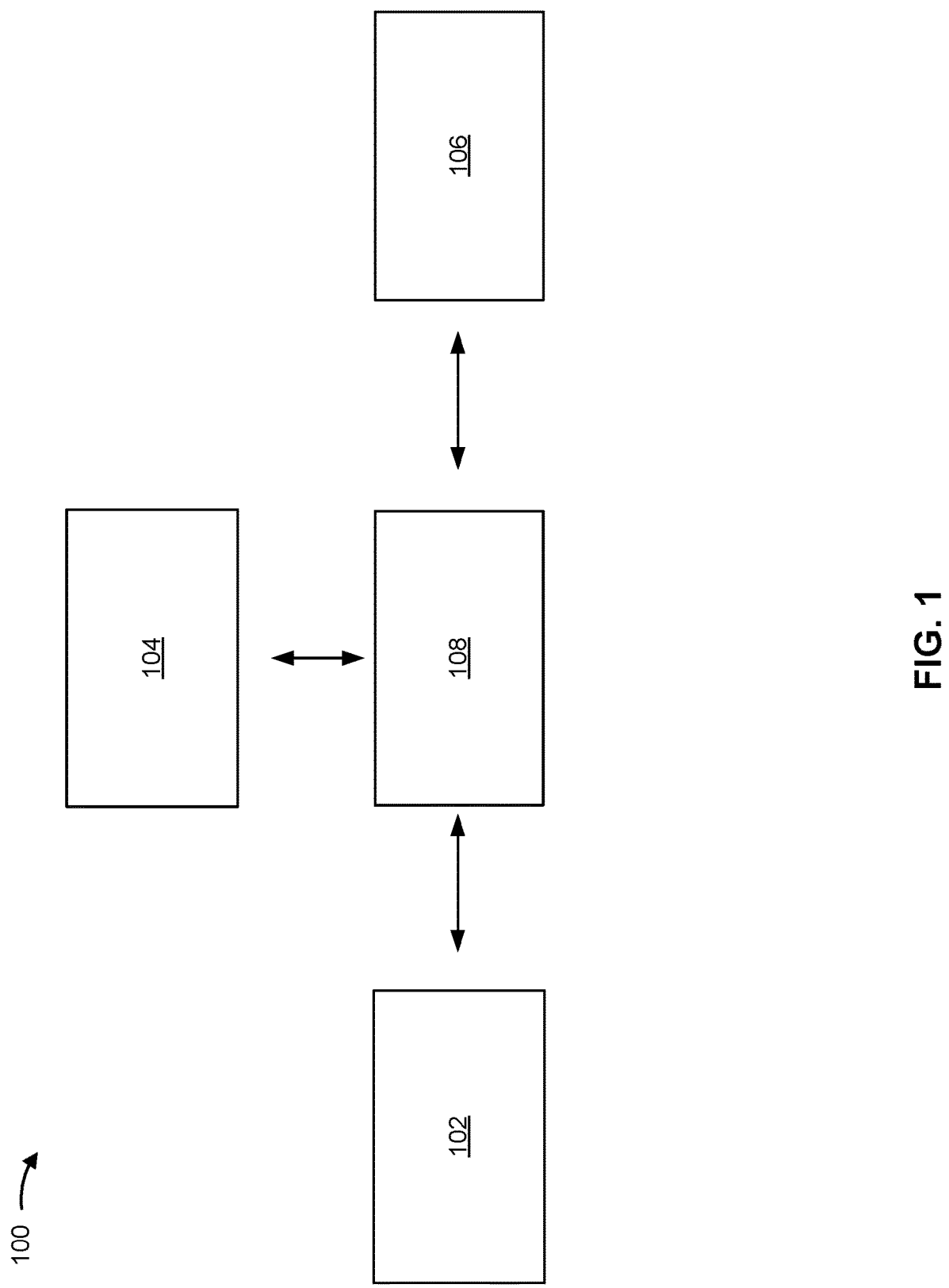
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "bottom," "above," "upper," and/or "top," among other examples, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a top portion of a nano structure (e.g., a structure used to form a GAA transistor), of a semiconductor device, may include a silicon-based structure (e.g., a top silicon layer). The silicon-based structure may be disposed as a layer of the nanostructure that extends between elements of a cladding structure. During a manufacturing process, the silicon-based structure may be covered by a first hard mask layer and a second hard mask layer (e.g., also disposed between the elements of the cladding structure). The second hard mask layer may be used to protect the silicon-based structure during a planarization operation on a top surface of the semiconductor device (e.g., including a top surface of the hard mask, the cladding structure, and/or a dielectric structure outside of the cladding structure). After the planarization operation, the second hard mask layer may be removed (e.g., etched) using the first hard mask layer to reduce an amount of etchant that reaches the silicon-based structure. However, based on the cladding structure extending to a greater height than the first hard mask layer, a manufacturer may either apply etchant for an amount of time that is sufficient to remove all of the hard mask (e.g., from corners at an interface between the first hard mask layer and the cladding structure) using over-etching, which may damage the first hard mask layer and reach the silicon-based structure. In this way, the semiconductor device may have reduced efficiency or may fail, which may waste resources used to manufacture the semiconductor device and/or resources needed to manufacture a replacement semiconductor device. Alternatively, the manufacturer may apply etchant for an amount of time that is insufficient to remove all of the hard mask, which may leave hard mask material to interfere with subsequent manufacturing operations in forming the semiconductor device. In this way, the semiconductor device may crack and/or one or more additional structures of the semiconductor device may fail, which may waste resources used to manufacture the semiconductor device and/or resources needed to manufacture a replacement semiconductor device.

Some implementations described herein provide techniques and apparatuses for forming a semiconductor device (e.g., a semiconductor structure that includes a GAA transistor). A method of forming the semiconductor device may include forming a nanostructure having alternating sheets of silicon-based material. The method may include depositing a silicon-based structure on a top surface of the nanostructure, depositing a first hard mask layer on the silicon-based structure, and depositing a second hard mask layer on the first hard mask layer. In some implementations, the method includes depositing a cladding structure on sidewalls of the nanostructure, with the cladding structure including elements of the cladding structure on sides of the nanostructure. The method further includes depositing a dielectric structure on a top surface of the elements of the cladding structure and on a top surface of the second hard mask layer. The method may then include performing a planarization operation to remove the dielectric structure from the top surface of the elements of the cladding structure and from the top surface of the second hard mask layer. The method further includes removing a top portion of the cladding structure before removing the second hard mask layer. After removal of the second hard mask layer, the method includes removing a portion of the cladding structure and the first hard mask layer to expose the silicon-based structure.

In this way, a difference in height between a top surface of the cladding structure and the first hard mask layer may be reduced, which may reduce an amount of residual material from the second hard mask layer (e.g., after performing an etching operation to remove the second hard mask layer) at an interface (e.g., in a corner) between the cladding structure and the first hard mask layer. Additionally, or alternatively, an amount of over-etching to remove the second hard mask layer may be reduced, which may reduce deterioration of the silicon-based structure. Based on reducing the amount of residual material from the second hard mask layer and/or reducing deterioration of the silicon-based material, a process window for a process of forming the semiconductor structure may be increased and defects may be reduced. In this way, the semiconductor device may have improved efficiency and may have a reduced likelihood of failure, which may conserve resources that may have otherwise been used to manufacture a replacement semiconductor device.

FIG. 1 is a diagram of an example environment 100 in which systems and/or methods described herein may be implemented. As shown in FIG. 1, environment 100 may include a plurality of semiconductor processing tools 102-106 and a wafer/die transport tool 108. The plurality of semiconductor processing tools 102-106 may include a deposition tool 102, an etching tool 104, a planarization tool 106, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

Wafer/die transport tool 108 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-106 and/or to and from other locations such as a wafer rack, a storage room, or another location. In some implementations, wafer/die transport tool 108 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

FIGS. 2A-2K are diagrams of an example implementation of forming a semiconductor device 200 described herein. The example implementation may be an example process for forming a portion of a semiconductor device that includes a nanostructure transistor, such as a nanowire transistor, a nanosheet transistor, a gate-all-around (GAA) transistor, and/or a multi bridge channel transistor, among other examples. The semiconductor device 200 may include one or more additional devices, structures, and/or layers not shown in FIGS. 2A-2K. For example, the semiconductor device 200 may include additional layers formed on layers above and/or below the portion of the semiconductor device 200 shown in FIGS. 2A-2K. Additionally, or alternatively, one or more additional semiconductor structures may be formed in a same layer, with a lateral displacement, as the portion of the semiconductor device 200 shown in FIGS. 2A-2K.

Figure 2A:
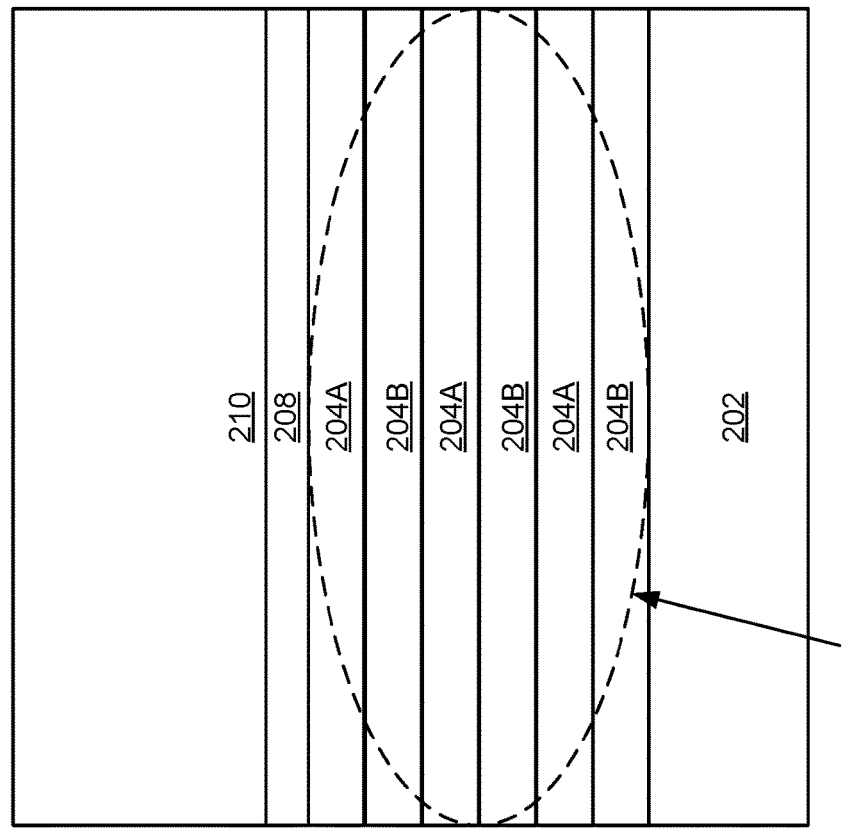
Figure 2A:
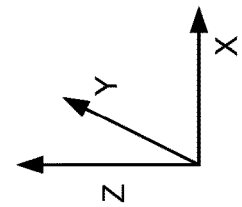

As shown in FIG. 2A, the semiconductor device 200 may include a substrate 202. The substrate 202 may include a semiconductor die substrate, a semiconductor wafer, or another type of substrate in and/or on which semiconductor devices and/or structures may be formed. In some implementations, the substrate 202 is formed of silicon (Si), a material including silicon, a III-V compound semiconductor material such as gallium arsenide (GaAs), a silicon on insulator (SOI), or another type of semiconductor material. The substrate may further include one or more fin-based structures.

Silicon-based layers 204A (e.g., pure silicon and/or silicon with a concentration of germanium that is less than 1%) and silicon based-layers 204B (e.g., silicon germanium) are alternatingly disposed on top of one another (e.g., along a Z direction of the semiconductor device 200) to form a stack. For example, one of the silicon-based layers 204A is disposed over one of the silicon-based layers 204B then another one of the silicon-based layers 204B is disposed over the silicon-based layers 204A, so on and so forth. The silicon-based layers 204A and 204B have different compositions of material (e.g., one being silicon germanium and the other being silicon).

The stack may include any number of alternately disposed silicon-based layers 204A and 204B that form a nanostructure 204. The silicon-based layers 204A and 204B may have different thicknesses. The silicon-based layers 204A may have different thicknesses from one layer to another layer. The silicon-based layers 204B may have different thicknesses from one layer to another layer. The thickness of each of the silicon-based layers 204A and 204B may range from few nanometers to few tens of nanometers. Either the silicon-based layers 204A or the silicon-based layers 204B may form a bottommost layer (or the layer most proximate to the substrate 202).

The silicon-based layers 204A and 204B may be grown from the substrate 202. For example, each of the silicon-based layers 204A and 204B may be grown by a molecular beam epitaxy (MBE) process, a chemical vapor deposition (CVD) process such as a metal organic CVD (MOCVD) process, and/or other suitable growth processes. During the epitaxial growth, the crystal structure of the substrate 202 extends upwardly, resulting in the silicon-based layers 204A and 204B having the same crystal orientation with the substrate 202. The silicon-based layers 204A and 204B continuously extend along the X-direction.

The nanostructure 204 may include a top layer of the silicon-based layers 204A. The top layer of the silicon-based layers 204A may be a top layer of the nanostructure 204 and may form a top surface of the nanostructure 204. The top layer of the silicon-based layers 204A may be configured to provide a channel between source/drains and through a gate structure to be deposited in a later deposition operation. In some implementations, another material (e.g., other than a silicon-based structure) may be used in place of the top layer of the silicon-based layers 204A in the context of this disclosure. For example, another type of channel material or sacrificial material may be used in place of the top layer of the silicon-based layers 204A.

The semiconductor device 200 may include a first hard mask layer 208 on the top surface of the top layer of the silicon-based layers 204A (e.g., a top surface of the nanostructure 204). The semiconductor device 200 may also include a second hard mask layer 210 on the top surface of the first hard mask layer 208. In some implementations, a deposition tool (e.g., deposition tool 102) deposits the first hard mask layer 208 (e.g., a silicon germanium-based material) on the top surface of the top layer of the silicon-based layers 204A and/or the second hard mask layer 210 on a top surface of the first hard mask layer 208 using, for example, chemical vapor deposition, and/or physical vapor deposition, among other examples. The second hard mask layer 210 may include a silicon-based material that is a same material used to form the top layer of the silicon-based layers 204A.

In some implementations, the first hard mask layer 208 may be deposited with a thickness in a range of approximately 2 nanometers to approximately 8 nanometers. In this way, the first hard mask layer 208 is thick enough to allow for some etching during removal (e.g., via etching) of the second hard mask layer 210, but not too thick to require a long removal process (e.g., via etching) which would impact manufacturing efficiency. Additionally, having an unnecessarily large thickness of the first hard mask layer 208 may increase a cost of manufacturing the semiconductor device 200.

Figure 2B:
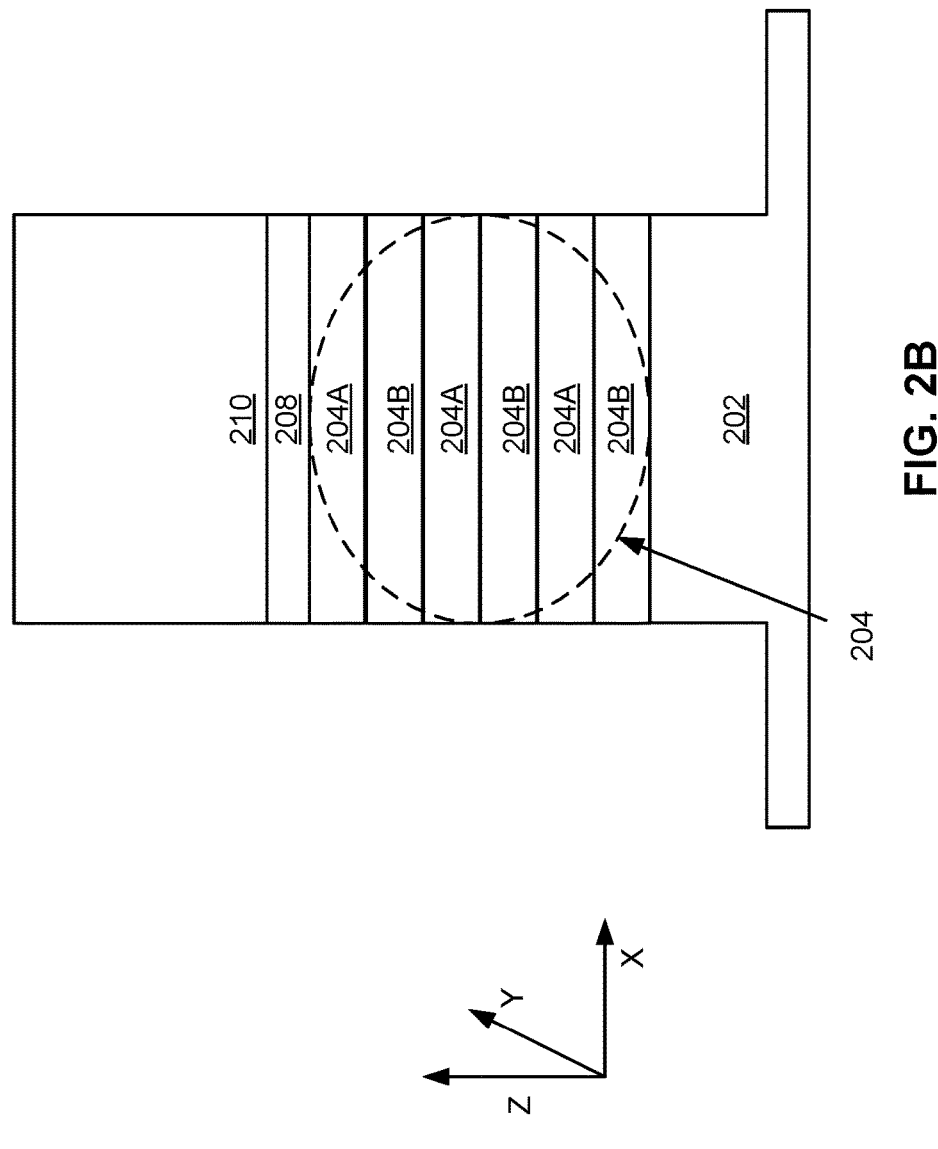

As shown in FIG. 2B, the stack of silicon-based layers 204A and 204B may be etched to form one or more fin structures. FIG. 2B shown only one fin structure; however, the stack may include additional fin structures not shown in FIG. 2B. Each of the fin structures, which is elongated along the Y-direction of the semiconductor device, may include a stack of silicon-based layers 204A and 204B alternatively stacked with each other. The semiconductor device 200 may include any number of fin structures while remaining within the scope of the present disclosure.

The fin structures are formed by patterning the silicon-based layers 204A and 204B and the substrate 202 using, for example, photolithography and etching techniques. For example, the second hard mask layer 210 is formed over the topmost silicon-based layers 204A and 204B. In some implementations, the second hard mask layer 210 can include one or more layers, each of which is formed of a semiconductor material similar to the material of the silicon-based layers 204A and 204B. In some implementations, the second hard mask layer 210 and the first hard mask layer 208 (e.g., a layer formed of silicon germanium) may collectively form a hard mask. In some implementations, the hard mask the first hard mask layer 208 is formed of SiGe and the second hard mask layer is formed of silicon.

The second hard mask layer 210 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the second hard mask layer 210 in this example, from subsequent processing steps, such as etching. For example, the photoresist material is used to pattern the second hard mask layer 210 to form a patterned mask that is patterned to cover topmost surfaces of the one or more fin structures.

The second hard mask layer 210 is subsequently used to pattern exposed portions of the silicon-based layers 204A and 204B and the substrate 202 to form trenches (or openings), thereby defining the one or more fin structures between adjacent trenches, as illustrated in FIG. 2B. The trenches continuously extend along the Y-direction. When multiple fin structures are formed, such a trench may be disposed between any adjacent ones of the fin structures. In some embodiments, the fin structures are formed by etching trenches in the silicon-based layers 204A and 204B and the substrate 202 using, for example, reactive ion etch (RIE), neutral beam etch (NBE), the like, any other suitable process, or combinations thereof. The etch may be anisotropic. In some embodiments, the trenches may be strips (when viewed from the top) parallel to each other, and closely spaced with respect to each other. In some embodiments, the trenches may be continuous and surround the fin structures.

As shown in FIG. 2C, the semiconductor device 200 may include isolation structures 212 (sometimes referred to as isolation regions) disposed during a stage of fabrication. As shown in FIG. 2C, each of the isolation structures 212 can be disposed adjacent to fins of the one or more fins (e.g., between adjacent ones of the fin structures) and at least partially embedded into respective lower portions of the fin structures (e.g., adjacent to portions of the substrate 202).

The isolation structures 212, which are formed of an insulation material, can electrically isolate neighboring active structures (e.g., fin structures) from each other. The isolation structures 212 continuously extend in the Y-direction. The insulation material may be an oxide, such as silicon oxide, a nitride, the like, any other suitable material, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, any other suitable method, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process or any other suitable process, may remove any excess insulation material and form a top surface of the insulation material and a top surface of the patterned masks 402 that are coplanar (not shown).

Next, the insulation material is recessed to form the isolation structures 212, as shown in FIG. 2C, which may be referred to as shallow trench isolations (STIs). The isolation structures 212 are recessed such that the fin structures protrude from between neighboring isolation structures 212. The isolation structures 212 may be recessed to where a top surface of the isolation structures 212 is below or even with a topmost surface of the substrate 202. Respective top surfaces of the isolation structures 212 may have a flat surface (as illustrated), a convex surface, a concave surface (such as dishing), any other suitable surface, or combinations thereof. The top surfaces of the isolation structures 212 may be formed flat, convex, and/or concave by an appropriate etch. The isolation structures 212 may be recessed using an acceptable etching process, such as one that is selective to the material of the isolation structures 212. For example, a dry etch or a wet etch using dilute hydrofluoric (DHF) acid may be performed to recess the isolation structures 212.

Figure 2D:
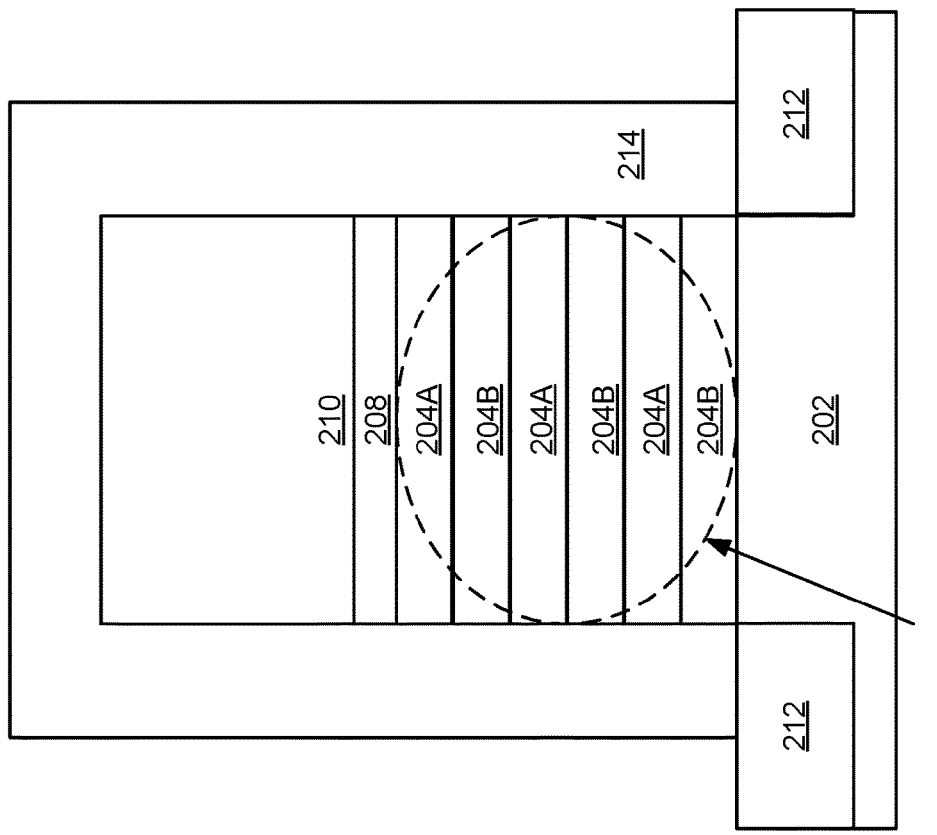

As shown in FIG. 2D, the semiconductor device 200 may include a cladding structure 214 disposed during one of the various stages of fabrication. As shown in FIG. 2D, the cladding structure 214 may extend along a top portion and sidewalls of each of the fin structures (e.g., a stack) with a first oxide-based layer optionally interposed therebetween.

After the isolation structures 212 are formed, the cladding structure 214 may be conformally deposited over the fin structure. For example, the cladding structure 214 may be formed to overlay a top surface (with the patterned mask layer 210 disposed therebetween) and extend along the sidewalls of the fin structure. In some implementations, the cladding structure 214 may be epitaxially grown from the fin structures (e.g., when no first oxide-based layer is formed). As such, a majority of the cladding structure 214 is formed around the fin structure, with a minority of the cladding structure 214 formed to overlay the isolation structures 212 (not shown). The cladding structure 214 may include the same material as one of the alternating silicon-based layers 204A and 204B, for example, the silicon-based layers 204A or 204B that function as sacrificial layers. In some implementations, the cladding material may include a silicon-metalloid compound, such as a silicon (Si) germanium (Ge)-based material. In some implementations, the silicon germanium-based material may include a concentration of germanium in a range of approximately 16% to approximately 30%. In this way, the silicon germanium-based material may be selectively etched (e.g., using a chemical etchant) separately from a silicon-based material.

The cladding structure may provide structural support to the nanostructure during a manufacturing process. For example, the cladding structure 214 may support the set of silicon-based layers 204A or the set of silicon-based layers 204B during a later manufacturing operation (e.g., removal of one of the set of silicon-based layers 204A or the set of silicon-based layers 204B). The cladding structure 214 may also provide electrical insulation between the nanostructure 204 and other semiconductor structures of the semiconductor device 200.

For example, one of the silicon-based layers 204A or 204B may be later removed to allow the other of the silicon-based layers 204A or 204B to be wrapped around by an active gate structure. Thus, in the example where the silicon-based layers 204B include silicon germanium, the cladding structure 214 may also include silicon germanium.

In some embodiments, a first oxide-based layer may first be conformally formed over the fin structure prior to forming the cladding structure 214. The first oxide-based layer can function as a portion of a gate dielectric, in some embodiments. The first oxide-based layer may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD.

Figure 2E:
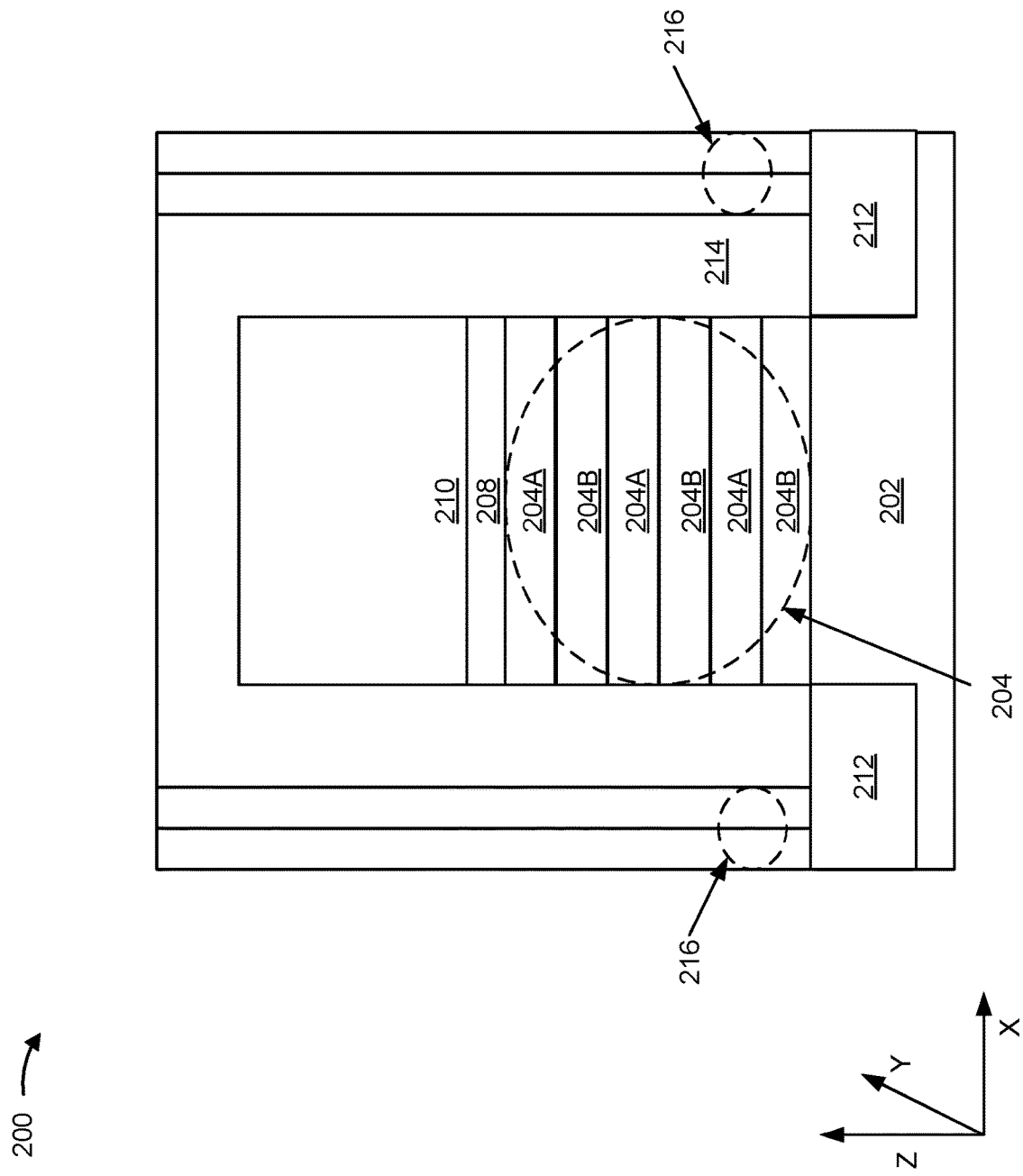

As shown in FIG. 2E, the semiconductor device 200 may include one more dielectric structures 216. The one or more dielectric structures 216 may a nitride-based dielectric layer disposed on sidewalls of the cladding structure 214 during one of the various stages of fabrication. As shown in FIG. 2E, the one or more dielectric structures 216 may include the nitride-based dielectric layer extending along the sidewalls of the cladding structure 214 and a top portion of the isolation structures 212, with a second oxide-based layer disposed along the sidewalls of the nitride based dielectric layer.

After the cladding structure 214 is formed, the nitride-based dielectric layer may be conformally deposited over the sidewalls of the cladding structure 214 and the top portion of the isolation structures 212. The nitride-based dielectric layer may comprise SiCN or any other suitable material and may be formed by any suitable deposition process such as CVD (such as PECVD, HARP, or combinations thereof) process, ALD process, another applicable process, or a combination thereof. In some embodiments, the second oxide-based layer may be conformally formed over the cladding structure 214 prior to forming the nitride-based dielectric layer of the one more dielectric structures 216. The second oxide-based layer may function as a protection layer for the cladding structure 214 while etching the nitride-based dielectric layer. The second oxide-based layer may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD.

In some aspects, the one or more dielectric structures 216 may include a third oxide-based layer disposed during one of the various stages of fabrication. The third oxide-based layer may extend along the bottom portion and the sidewalls of the nitride-based dielectric layer and extend continuously in the Y-direction of the semiconductor device 200.

After the nitride-based dielectric layer is formed, the third oxide-based layer is formed in trenches between fins (e.g., stacks). The third oxide-based layer may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. The oxide-based layer is first formed to be coplanar with top surfaces of the cladding structure 214. Respective top surfaces of the third oxide-based layer may have a flat surface, a convex surface, a concave surface (such as dishing), any other suitable surface, or combinations thereof. The top surfaces of the third oxide-based layer may be formed flat, convex, and/or concave by an appropriate etch or a planarization process, such as a CMP process. The third oxide-based layer may be then recessed using a suitable etching process, such as one that is selective to the material of the third oxide-based layer.

Figure 2F:
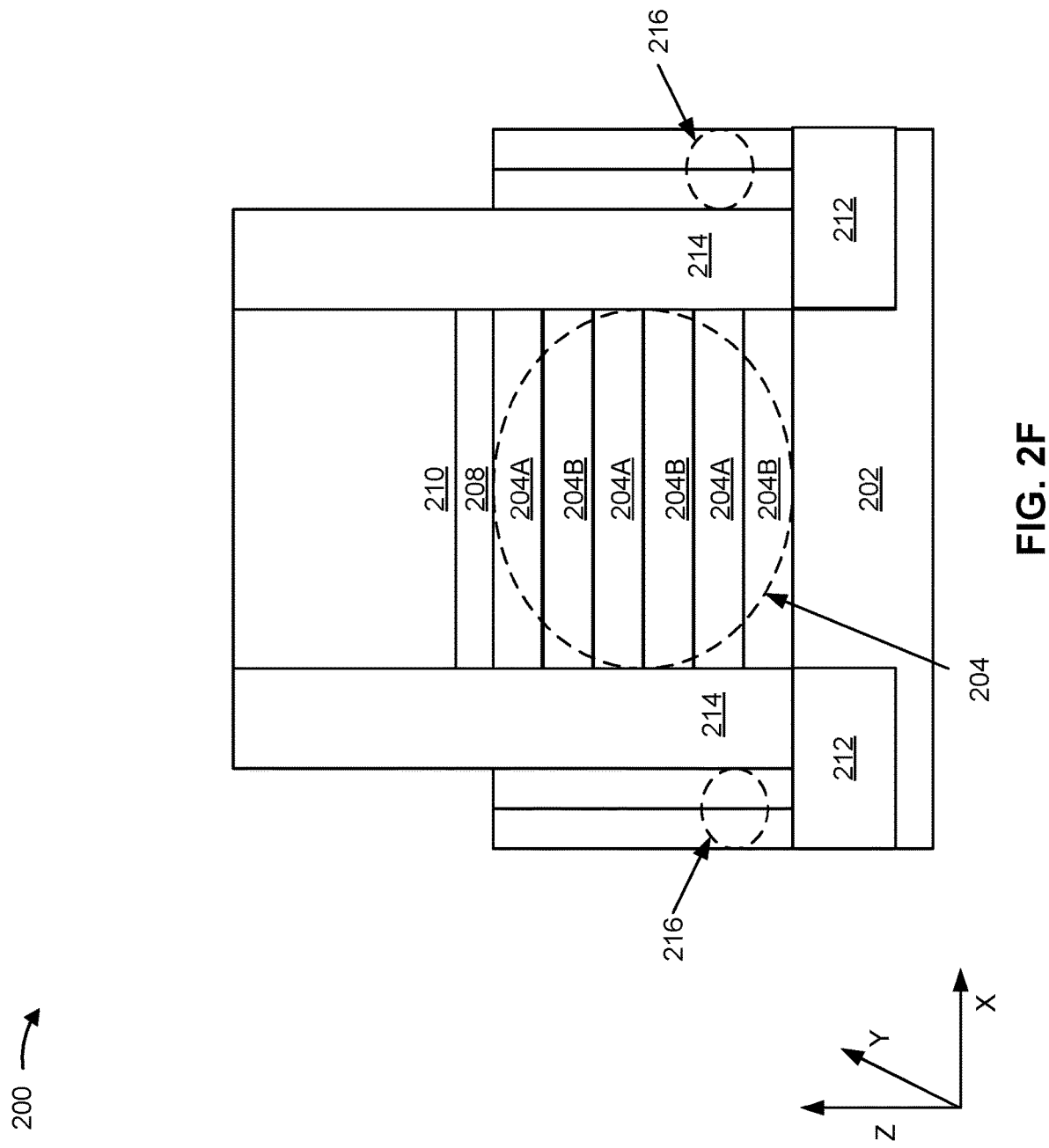

As shown in FIG. 2F, the one or more dielectric structures 216 may be etched back such that top surfaces of layers of the one or more dielectric structures 216 are recessed from a top surface of the cladding structure 214. Additionally, an upper portion of the cladding structure 214 may be removed (e.g., via a planarization process) to form elements of the cladding structure 214 on sidewalls of the fin.

Figure 2G:
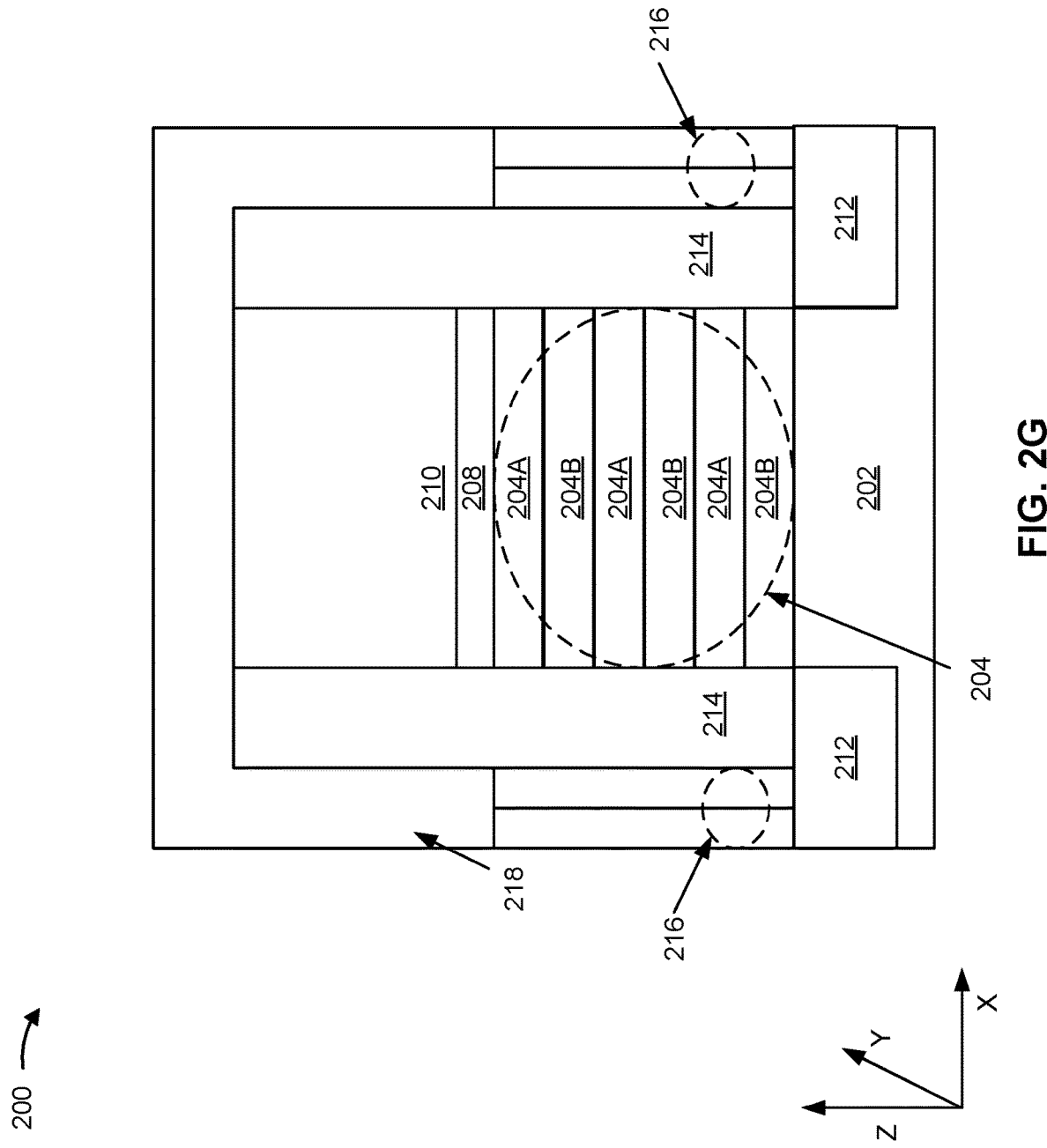

As shown in FIG. 2G, a dielectric structure 218 (e.g., a high-k dielectric) is formed on upper surfaces of the layers of the one or more dielectric structures 216, upper surfaces of the elements of the cladding structure 214, and/or an upper surface of the second hard mask layer 210. The dielectric structure 218 may include a high-k dielectric material such as hafnium oxide, among other examples. The dielectric structure 218 may include a capping layer. The capping layer may be provided to avoid content of dielectric structure 218 (e.g., a HK dielectric) diffusing outside and contaminating a semiconductor tool, during a later annealing process. The capping layer can be removed after annealing process. In some implementations, one or more semiconductor processing tools (e.g., deposition tool 102) form the dielectric structure 218 using chemical vapor deposition, physical vapor deposition, and/or reflow, among other examples, to deposit the material of the dielectric structure 218 on the top surface of the one or more dielectric structures 216.

In some implementations, the first hard mask layer 208 includes a same material as the cladding structure 214. For example, the first hard mask layer 208 and the cladding structure 214 may both include a silicon germanium-based material (e.g., SiGe). In some implementations, the first hard mask layer 208 may include a concentration of germanium that is equal to or higher than a concentration of germanium in the cladding structure 214. For example, the first hard mask layer 208 and the cladding structure 214 may have concentrations of germanium in a range of approximately 16% to approximately 30%. In some implementations, the first hard mask layer 208 may have a concentration of approximately 25% and the cladding structure 214 may have a concentration in a range of approximately 21%. In this way, the cladding structure 214 may be etched at a faster rate than the first hard mask layer 208 when using an etchant configured for a lower concentration of germanium (e.g., configured to etch the cladding structure 214).

Figure 2H:
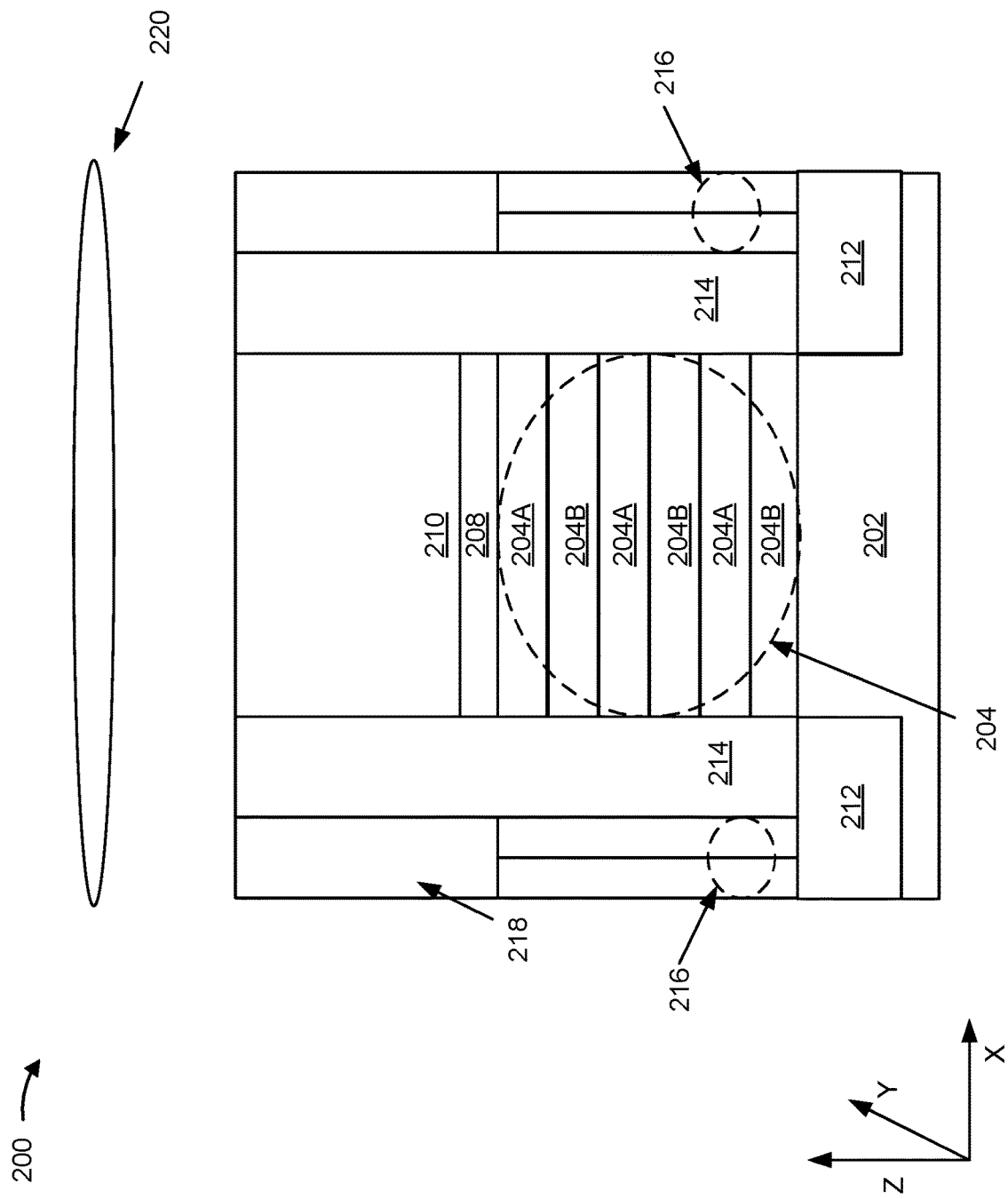

As shown in FIG. 2H, one or more semiconductor processing tools may planarize a top surface of the semiconductor device 200. In some implementations, a planarization tool (e.g., planarization tool 106) may perform a planarization operation 220 to planarize a top surface of the semiconductor device 200 to remove material of the dielectric structure 218 from a top surface of the cladding structure 214 and/or the second hard mask layer 210, among other semiconductor structures of the semiconductor device 200. In some implementations, the second hard mask layer 210 is configured stop layer for the planarization operation to indicate that the planarization operation 220 is complete (e.g., the planarization operation is to cease). In this way, the second hard mask layer 210 may protect the first hard mask layer 208 and the cladding structure 214 (e.g., from damage) during the planarization operation 220. After the planarization operation 220, top surfaces of the cladding structure 214 and/or the second hard mask layer 210 may be exposed after the planarization operation 220.

Figure 2I:
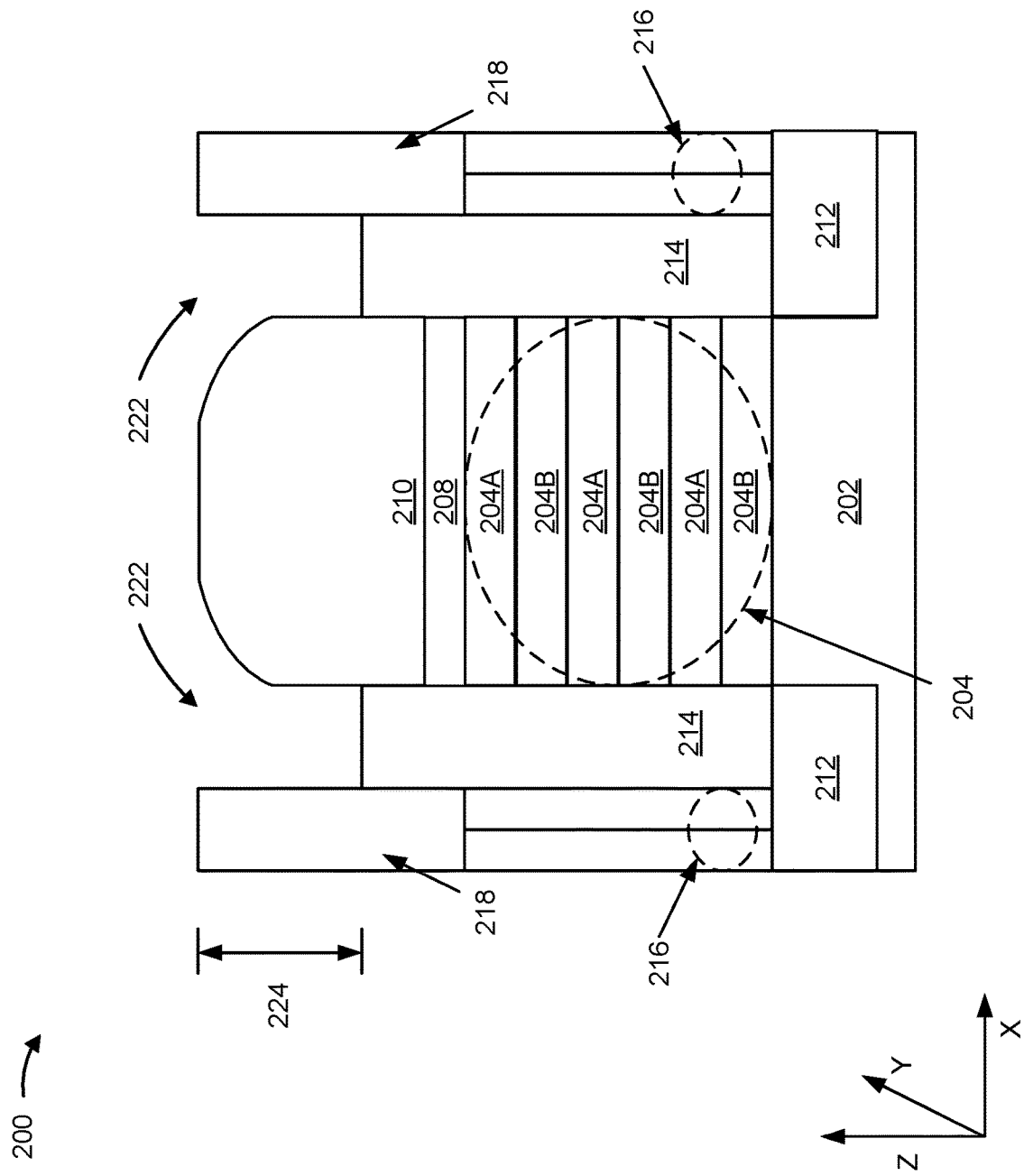

As shown in FIG. 2I, one or more semiconductor processing tools may remove a top portion of the cladding structure 214 to form recessed portions 222 of the cladding structure 214 after depositing the second hard mask layer 210 and/or after performing the planarization operation 220. In some implementations, an etching tool (e.g., etching tool 104) etches the top portion of the cladding structure 214 based on performing a wet etching process to remove the top portion of the cladding structure 214 (e.g., a first top portion of the cladding structure 214). In some implementations, performing the wet etching process includes applying a fluid with high selectivity for removing material of the cladding structure 214. For example, the fluid may include a chemical configured to react with a silicon germanium-based material of the cladding structure 214. In some implementations, a wet etching process may remove one or more portions of the second hard mask layer 210. For example, the wet etching process may remove corners and/or edges from an upper surface of the second hard mask layer 210. In some implementations, the wet etching process may remove the one or more portions of the second hard mask layer 210 based on the second hard mask layer 210 including one or more materials that are included in the cladding structure 214. For example, the wet etching process may use an etchant that is configured to remove silicon germanium-based material of the cladding structure 214 and the etchant may also remove the one or more portions of the second hard mask layer 210 based on the second hard mask layer 210 including silicon-based material. In this example, the etchant may remove material of the cladding structure 214 at a rate that is faster than a rate of removal of material of the second hard mask layer 210.

Based on removing the top portion of the cladding structure 214, a top surface of the cladding structure 214 may be lower than a top-most surface of the second hard mask layer 210. For example, after removing the top portion of the cladding structure 214, a distance 224 between the top surface of the cladding structure 214 and a topmost surface of the second hard mask layer 210 may be in a range of approximately 12 nanometers to approximately 18 nanometers. In some implementations, the distance 224 is in a range of approximately one-half to two-thirds of a thickness of the second hard mask layer 210 before etching the top portion of the cladding structure 214. In this way, the cladding structure 214 is low enough to expose a sufficient amount of side surfaces (e.g., one-half to two-thirds) of the second hard mask layer 210 to allow for efficient etching of the second hard mask layer 210 while reducing, or avoiding, leaving excess hard mask material in corners between the cladding structure 214 and the first hard mask layer 208.

Figure 2J:
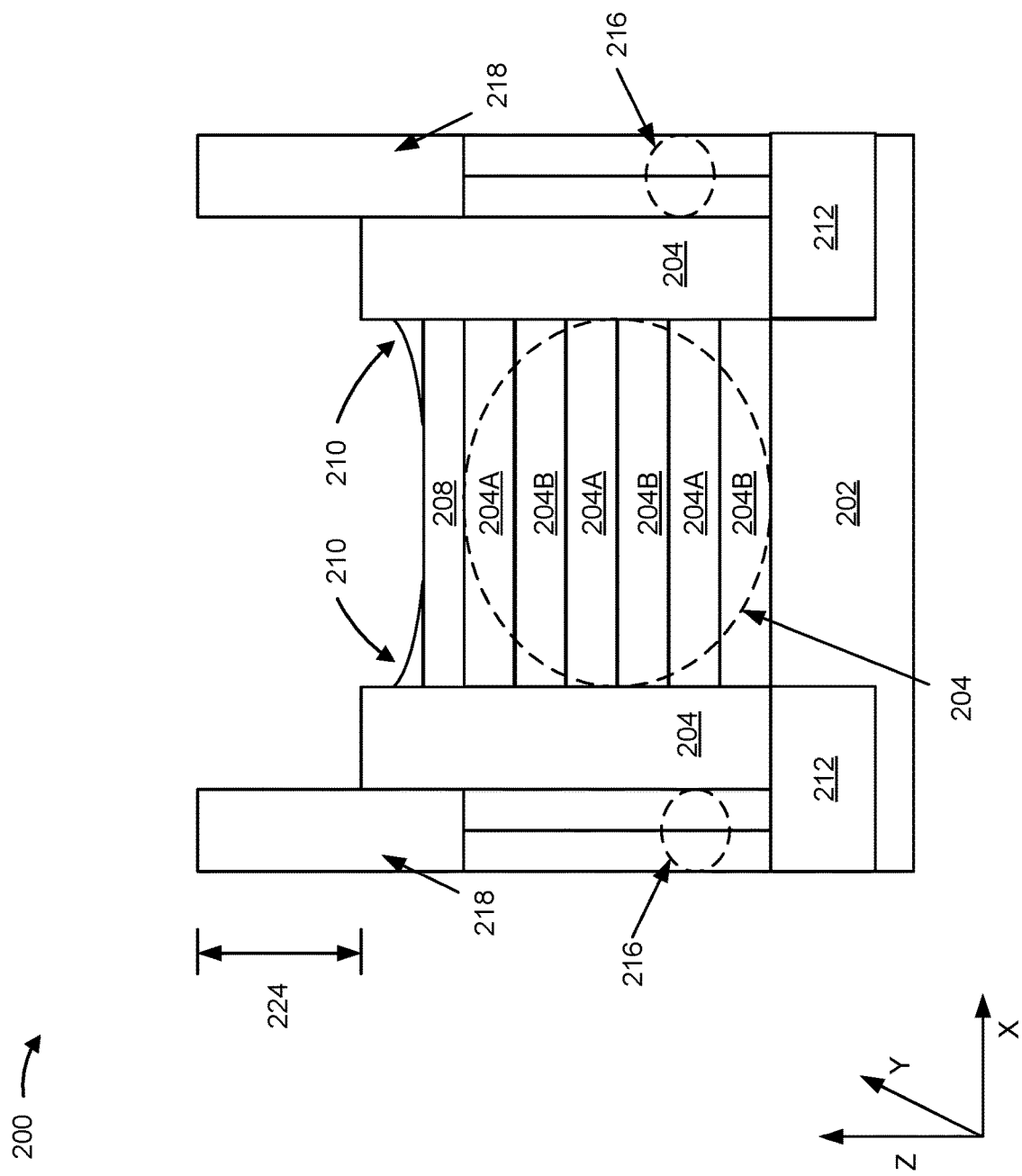

As shown in FIG. 2J, one or more semiconductor processing tools may remove the second hard mask layer 210 after removing the top portion of the cladding structure 214. In some implementations, an etching tool (e.g., etching tool 104) etches the second hard mask layer 210 based on performing a wet etching process to remove the second hard mask layer 210. In some implementations, performing the wet etching process includes applying a fluid with high selectivity for removing material of the second hard mask layer 210. For example, the fluid may include a chemical configured to react with a silicon-based material of the second hard mask layer 210. After etching the second hard mask layer 210, one or more portions of the second hard mask layer 210 may remain (e.g., in a corner where the top layer of the silicon-based layers 204A and elements of the cladding structure 204 intersect).

In some implementations, a wet etching process may remove one or more portions of the cladding structure 214 and/or the first hard mask layer 208. For example, the wet etching process may remove corners and/or edges from an upper surface of the cladding structure 214 and/or a middle portion of the first hard mask layer 208. In some implementations, the wet etching process may remove one or more portions of the cladding structure 214 and/or the first hard mask layer 208 based on one or more portions of the cladding structure 214 and/or the first hard mask layer 208 including one or more materials that are included in the second hard mask layer 210. For example, the wet etching process may use an etchant that is configured to remove silicon-based material of the second hard mask layer 210, and the etchant may also remove the one or more portions of the cladding structure 214 and/or the first hard mask layer 208 based on the cladding structure 214 and/or the first hard mask layer 208 including silicon germanium-based material. In this example, the etchant may remove material of the second hard mask layer 210 at a rate that is faster than a rate of removal of the cladding structure 214 and/or the first hard mask layer 208. In some implementations, after removing the second hard mask layer 210, a top surface of the first hard mask layer 208 may be substantially free from material of the second hard mask layer 210 (e.g., based on first removing the top portion of the cladding structure 214).

As shown in FIG. 2K, one or more semiconductor processing tools may remove an additional top portion (e.g., a second top portion) of the cladding structure 214 and the first hard mask layer 208 after removing the second hard mask layer 210. In some implementations, an etching tool (e.g., etching tool 104) etches the additional top portion of the cladding structure 214 (e.g., a portion of the cladding structure 214 that extends above a top surface of the top layer of the silicon-based layers 204A) and the first hard mask layer 208 based on performing one or more wet etching processes configured to remove material of the cladding structure 214 and the first hard mask layer 208. In some implementations, performing the wet etching process includes applying a fluid with high selectivity for removing material of the cladding structure 214 and the first hard mask layer 208 (e.g., where the cladding structure 214 comprises substantially a same material as the first hard mask layer 208, such as a silicon germanium-based material with a same or different concentration of germanium). For example, removing the additional portion of the cladding structure 214 and removing the first hard mask layer 208 includes a single etching operation that is configured for selective etching of the same material included in the cladding structure 214 and the first hard mask layer 208. In some implementations, the single etching operation may also remove one or more portions of the second hard mask layer 210 that remained after etching the second hard mask layer 210.

In some implementations, one or more semiconductor processing tools (e.g., the etching tool 104) perform a cleaning operation on the cladding structure 214 and the top layer of the silicon-based layers 204A after removing the additional portion of the cladding structure 214 and removing the first hard mask layer 208. The cleaning operation may remove residual materials of the first hard mask layer 208 and/or the cladding structure 214 above a top surface of the top layer of the silicon-based layers 204A.

In some implementations, based on removing the additional top portion of the cladding structure (e.g., in an operation that is separate, by an operation of removing the hard mask, from removing the top portion as described in connection with FIG. 2E), removing the first hard mask layer 208, and/or performing the cleaning operation, a top surface of the cladding structure 214 may be at a height that is approximately equal to, or less than, a height of the top surface of the top layer of the silicon-based layers 204A. Additionally, or alternatively, the top layer of the silicon-based layers 204A may form a top surface of the nanostructure 204 (e.g., which may be formed of a same material as the silicon-based layers 204A) and may extend between (e.g., continuously between) elements of the cladding structure 214. The top layer of the silicon-based layers 204A and/or the cladding structure 214 may further provide a substantially planar top surface of the nanostructure 204 for improved deposition of subsequent layers of the semiconductor device 200. Additionally, or alternatively, the top surface of the nanostructure 204 may be substantially free of material of the first hard mask layer 208 and of material of the second hard mask layer 210. In this way, the semiconductor device 200 may have improved efficiency and may have a reduced likelihood of failure, which may conserve resources that may have otherwise been used to manufacture a replacement semiconductor device.

After removing the additional top portion of the cladding structure 214 and the first hard mask layer 208 after removing the second hard mask layer 210, one or more semiconductor processing tools may perform one or more additional operations to form a gate-all-around (GAA) device within the semiconductor device 200. For example, the one or more semiconductor processing tools may perform a metal gate deposition process. The metal gate deposition process may include forming a poly gate on the nanostructure 204, forming a spacer and/or inner spacer between layers of the nanostructure, forming a source/drain, and etching the poly gate and one of the silicon-based layers 204A or 204B (e.g., a sacrificial layer of the stack) to provide a volume surrounding a remaining one of the silicon-based layers 204A or 204B. A deposition tool (e.g., deposition tool 102) may deposit one or more dielectric layers (e.g., an interfacial layer and/or a high-k dielectric) on the remaining one of the silicon-based layers 204A or 204B to provide electrical insulation around the remaining one of the silicon-based layers 204A or 204B. the deposition tool may deposit one or more layers of a gate material, such as a work function metal on the one or more dielectric layers around the remaining one of the silicon-based layers 204A or 204B and a filling metal to fill the volume surrounding the remaining one of the silicon-based layers 204A or 204B. In this way, the remaining one of the silicon-based layers 204A or 204B may function as channels through the gate material, which may then be used to store information as a transistor (e.g., a nanostructure device and/or a nanostructure transistor).

After forming the GAA device, the deposition tool may deposit one or more materials between the elements of the dielectric structure 218. For example, the one or more semiconductor processing tools may remove the cladding structure 214 and form a source/drain region. One or more contacts may be formed for the source/drain and for the gate region. The one or more contacts may be formed to connect the semiconductor device 200 with a metal line in back end of line (BEOL) region.

As indicated above, FIGS. 2A-2K are provided as an example. Other examples may differ from what is described with regard to FIGS. 2A-2K.

Figure 3:
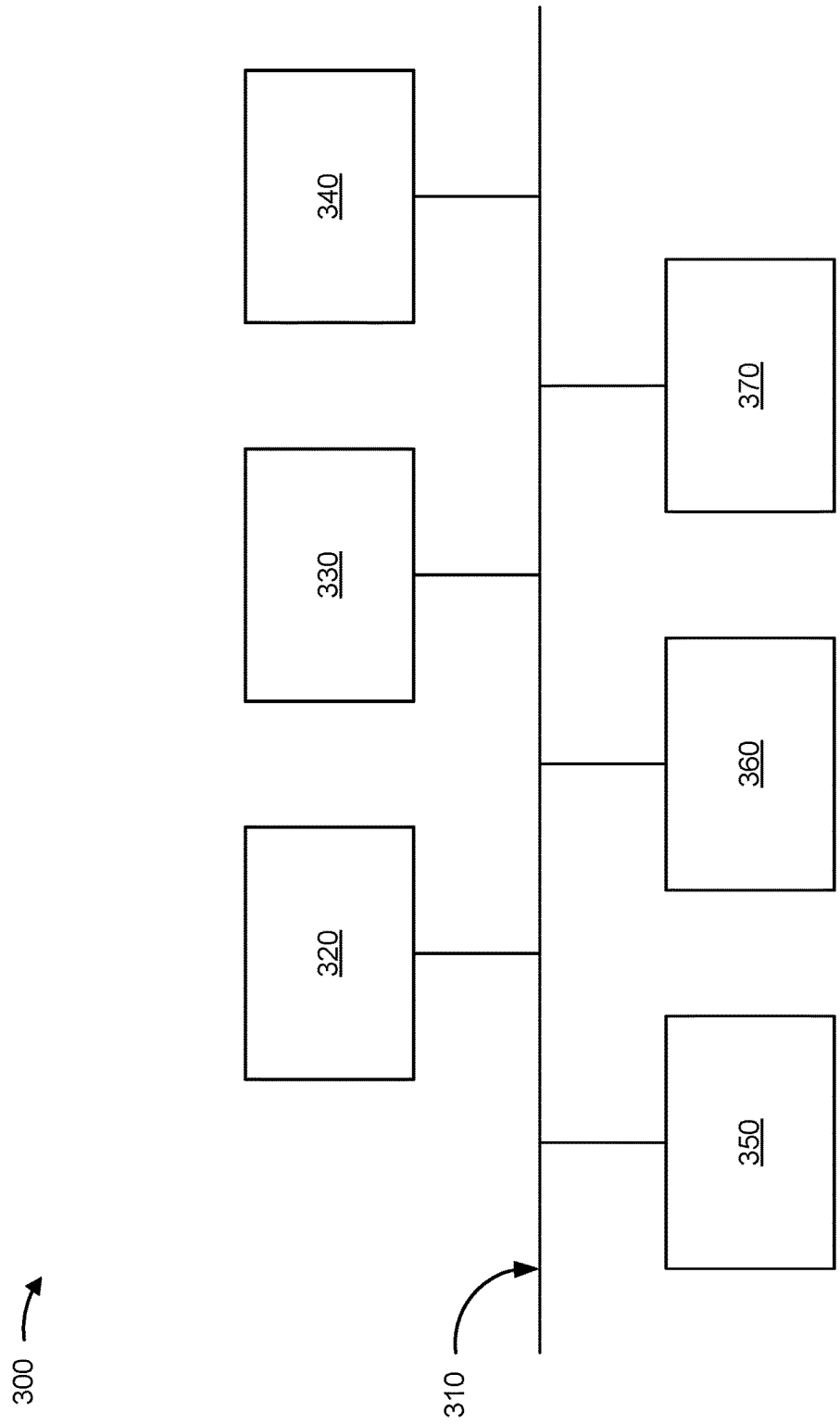
FIG. 3 is a diagram of example components of one or more devices of FIG. 1.

FIG. 3 is a diagram of example components of a device 300, which may correspond to deposition tool 102, etching tool 104, planarization tool 106, and/or wafer/die transport tool 108. In some implementations, deposition tool 102, etching tool 104, planarization tool 106, and/or wafer/die transport tool 108 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory, a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, and/or an actuator. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, and/or an antenna.

Device 300 may perform one or more processes described herein. For example, a non-transitory computer-readable medium (e.g., memory 330 and/or storage component 340) may store a set of instructions (e.g., one or more instructions, code, software code, and/or program code) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
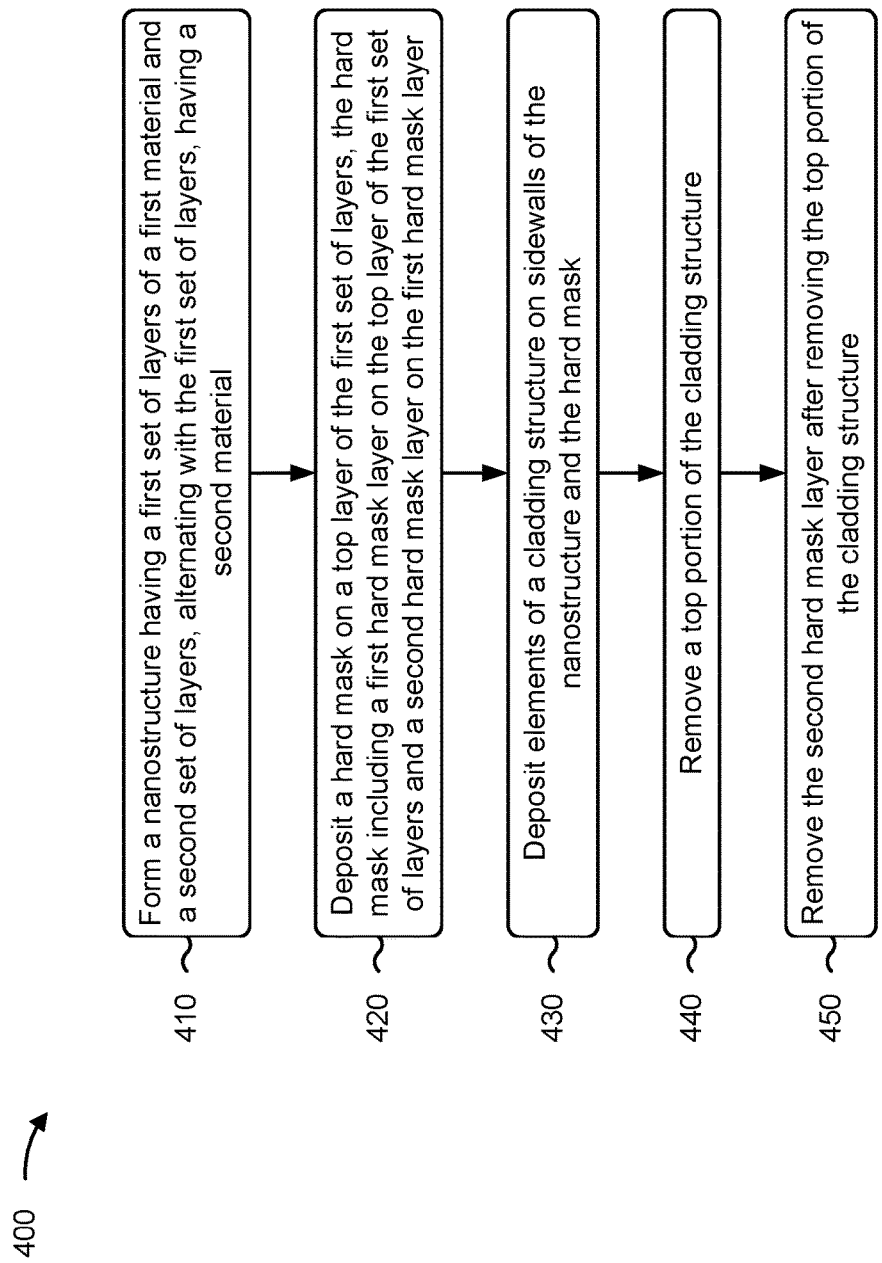
FIGS. 4-6 are flowcharts of example processes relating to methods of manufacturing a silicon facet.

FIG. 4 is a flowchart of an example process 400 associated with a nanostructure and manufacturing method thereof. In some implementations, one or more process blocks of FIG. 4 may be performed by one or more semiconductor processing tools (e.g., deposition tool 102, etching tool 104, planarization tool 106, and/or wafer/die transport tool 108). Additionally, or alternatively, one or more process blocks of FIG. 4 may be performed by one or more components of device 300, such as processor 320, memory 330, storage component 340, input component 350, output component 360, and/or communication component 370.

As shown in FIG. 4, process 400 may include forming a nanostructure having a first set of layers of a first material and a second set of layers, alternating with the first set of layers, having a second material (block 410). For example, the one or more semiconductor processing tools may form a nanostructure 204 having a first set of layers 204A of a first material and a second set of layers 204B, alternating with the first set of layers 204A, having a second material, as described above.

As further shown in FIG. 4, process 400 may include depositing a hard mask on a top layer of the first set of layers, the hard mask including a first hard mask layer on the top layer of the first set of layers and a second hard mask layer on the first hard mask layer (block 420). For example, the one or more semiconductor processing tools may deposit a hard mask on a top layer of the first set of layers 204A, the hard mask including a first hard mask layer 208 on the top layer of the first set of layers 204A and a second hard mask layer 210 on the first hard mask layer 208, as described above.

As further shown in FIG. 4, process 400 may include depositing elements of a cladding structure on sidewalls of the nanostructure and the hard mask (block 430). For example, the one or more semiconductor processing tools may deposit elements of a cladding structure 214 on sidewalls of the nanostructure 204 and the hard mask, as described above.

As further shown in FIG. 4, process 400 may include removing a top portion of the cladding structure (block 440). For example, the one or more semiconductor processing tools may remove a top portion of the cladding structure 214, as described above.

As further shown in FIG. 4, process 400 may include removing the second hard mask layer after removing the top portion of the cladding structure (block 450). For example, the one or more semiconductor processing tools may remove the second hard mask layer 210 after removing the top portion of the cladding structure 214, as described above.

Process 400 may include additional implementations, such as any single implementation or any combination of implementations described below and/or in connection with one or more other processes described elsewhere herein.

In a first implementation, process 400 includes depositing, after depositing the hard mask and before removing the top portion of the cladding structure, a dielectric structure on a top surface of the elements of the cladding structure and on a top surface of the hard mask, and performing a planarization operation to remove the dielectric structure from the top surface of the elements of the cladding structure and from the top surface of the hard mask.

In a second implementation, alone or in combination with the first implementation, the planarization operation is configured to cease based on reaching the first hard mask layer.

The method of claim 1, wherein, after removing the top portion of the cladding structure, a distance between a top surface of the cladding structure and a topmost surface of the second hard mask layer is in a range of approximately 12 nanometers to approximately 16 nanometers.

The method of claim 1, wherein, after removing the top portion of the cladding structure, a distance between a top surface of the cladding structure and a topmost surface of the second hard mask layer is in a range of approximately one-half to two-thirds of a thickness of the second hard mask layer before etching the top portion of the cladding structure.

In a third implementation, alone or in combination with one or more of the first and second implementations, the first hard mask layer has a thickness in a range of approximately 2 nanometers to approximately 8 nanometers.

In a fourth implementation, alone or in combination with one or more of the first through third implementations, the cladding structure comprises a silicon germanium-based material.

In a fifth implementation, alone or in combination with one or more of the first through fourth implementations, the first set of layers comprise channels of the nanostructure.

In a sixth implementation, alone or in combination with one or more of the first through fifth implementations, process 400 includes removing, after removing the second hard mask layer, an additional portion of the cladding structure that extends above a top surface of the top layer of the first set of layers, and removing the first hard mask layer.

In a seventh implementation, alone or in combination with one or more of the first through sixth implementations, the cladding structure and the first hard mask layer are formed of a same material, and wherein removing the additional portion of the cladding structure and removing the first hard mask layer comprise a single etching operation that is configured for selective etching of the same material.

In an eighth implementation, alone or in combination with one or more of the first through seventh implementations, process 400 includes performing, after removing the additional portion of the cladding structure and removing the etch stop layer, a cleaning operation on the cladding structure and the silicon-based structure.

In a ninth implementation, alone or in combination with one or more of the first through eighth implementations, the first hard mask layer is configured as an etch stop layer for an etching operation associated with removing the second hard mask layer.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
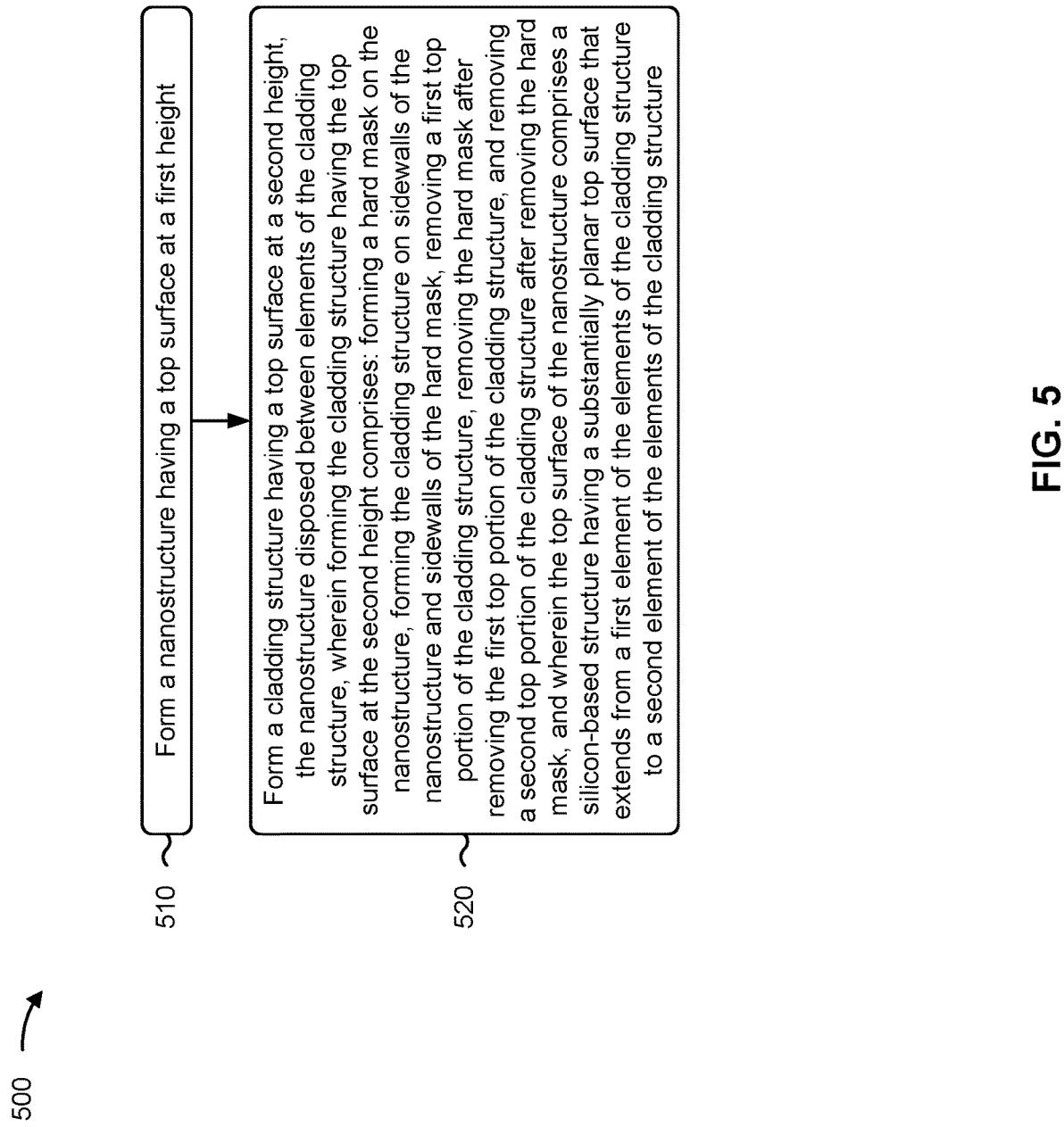

FIG. 5 is a flowchart of an example process 500 associated with a nanostructure and manufacturing method thereof. In some implementations, one or more process blocks of FIG. 5 may be performed by one or more semiconductor processing tools (e.g., deposition tool 102, etching tool 104, planarization tool 106, and/or wafer/die transport tool 108). Additionally, or alternatively, one or more process blocks of FIG. 5 may be performed by one or more components of device 300, such as processor 320, memory 330, storage component 340, input component 350, output component 360, and/or communication component 370.

As shown in FIG. 5, process 500 may include forming a nanostructure having a top surface at a first height (block 510). For example, the one or more semiconductor processing tools may form a nanostructure 204 having a top surface at a first height, as described above.

As further shown in FIG. 5, process 500 may include forming a cladding structure having a top surface at a second height, the nanostructure disposed between elements of the cladding structure (block 520). For example, the one or more semiconductor processing tools may form a cladding structure 214 having a top surface at a second height, the nanostructure 204 disposed between elements of the cladding structure 214, as described above. In some implementations, forming a cladding structure 214 having a top surface at a second height includes forming a hard mask 208 and/or 210 on the nanostructure 204, forming the cladding structure 214 on sidewalls of the nanostructure 204 and sidewalls of the hard mask 208 and/or 210, removing a first top portion of the cladding structure 214, removing the hard mask 208 and/or 210 after removing the first top portion of the cladding structure 214, and removing a second top portion of the cladding structure 214 after removing the hard mask 208 and/or 210. In some implementations, the top surface of the nanostructure 204 comprises a silicon-based structure 204A having a substantially planar top surface that extends from a first element of the elements of the cladding structure 214 to a second element of the elements of the cladding structure 214.

Process 500 may include additional implementations, such as any single implementation or any combination of implementations described below and/or in connection with one or more other processes described elsewhere herein.

In a first implementation, the top surface of the nanostructure is free of material of a first hard mask layer and material of a second hard mask layer.

In a second implementation, alone or in combination with the first implementation, the cladding structure comprises a silicon germanium-based material.

In a third implementation, alone or in combination with one or more of the first and second implementations, the silicon germanium-based material has a concentration of germanium in a range of approximately 18% to approximately 30%.

In a fourth implementation, alone or in combination with one or more of the first through third implementations, the semiconductor device comprises a dielectric structure disposed on the top surface of the cladding structure and on the top surface of the nanostructure.

In a fifth implementation, alone or in combination with one or more of the first through third implementations, the second height is approximately equal to, or less than, the first height.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
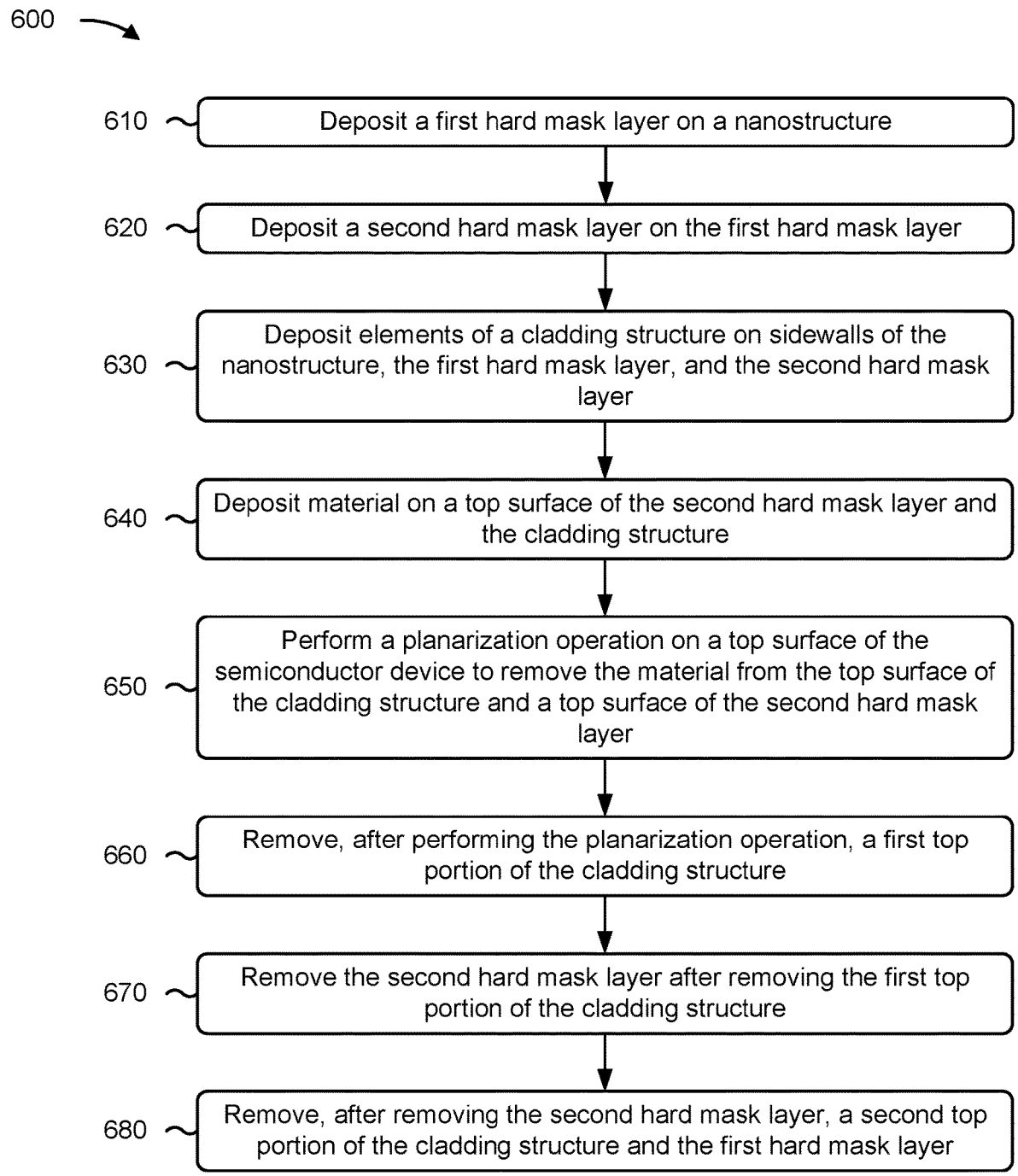

FIG. 6 is a flowchart of an example process 600 associated with a nanostructure and manufacturing method thereof. In some implementations, one or more process blocks of FIG. 6 may be performed by one or more semiconductor processing tools (e.g., deposition tool 102, etching tool 104, planarization tool 106, and/or wafer/die transport tool 108). Additionally, or alternatively, one or more process blocks of FIG. 6 may be performed by one or more components of device 300, such as processor 320, memory 330, storage component 340, input component 350, output component 360, and/or communication component 370.

As shown in FIG. 6, process 600 may include depositing a first hard mask layer on a nanostructure (block 610). For example, the one or more semiconductor processing tools may deposit a first hard mask layer 208 on a nanostructure 204, as described above.

As further shown in FIG. 6, process 600 may include depositing a second hard mask layer on the first hard mask layer (block 620). For example, the one or more semiconductor processing tools may deposit a second hard mask layer 210 on the first hard mask layer 208, as described above.

As further shown in FIG. 6, process 600 may include depositing elements of a cladding structure on sidewalls of the nanostructure, the first hard mask layer, and the second hard mask layer (block 630). For example, the one or more semiconductor processing tools may deposit elements of a cladding structure 214 on sidewalls of the nanostructure 204, the first hard mask layer 208, and the second hard mask layer 210, as described above.

As further shown in FIG. 6, process 600 may include depositing material on a top surface of the second hard mask layer and the cladding structure (block 640). For example, the one or more semiconductor processing tools may deposit material on a top surface of the second hard mask layer 210 and the cladding structure 214, as described above.

As further shown in FIG. 6, process 600 may include performing a planarization operation on a top surface of the semiconductor device to remove the material from the top surface of the cladding structure and a top surface of the second hard mask layer (block 650). For example, the one or more semiconductor processing tools may perform a planarization operation 220 on a top surface of the semiconductor device 200 to remove the material from the top surface of the cladding structure 214 and a top surface of the second hard mask layer 210, as described above.

As further shown in FIG. 6, process 600 may include removing, after performing the planarization operation, a first top portion of the cladding structure (block 660). For example, the one or more semiconductor processing tools may remove, after performing the planarization operation, a first top portion of the cladding structure 214, as described above.

As further shown in FIG. 6, process 600 may include removing the second hard mask layer after removing the first top portion of the cladding structure (block 670). For example, the one or more semiconductor processing tools may remove the second hard mask layer 210 after removing the first top portion of the cladding structure 214, as described above.

As further shown in FIG. 6, process 600 may include removing, after removing the second hard mask layer, a second top portion of the cladding structure and the first hard mask layer (block 680). For example, the one or more semiconductor processing tools may remove, after removing the second hard mask layer 210, a second top portion of the cladding structure 214 and the first hard mask layer 208, as described above.

Process 600 may include additional implementations, such as any single implementation or any combination of implementations described below and/or in connection with one or more other processes described elsewhere herein.

In a first implementation, removing the first top portion of the cladding structure comprises performing a wet etching process to remove the first top portion of the cladding structure.

In a second implementation, alone or in combination with the first implementation, performing the wet etching process comprises applying a fluid with high selectivity for removing material of the cladding structure.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Based on etching a first top portion of a cladding structure 214 before etching a second hard mask layer 210, an amount of residual residue from the second hard mask layer 210 may be reduced, over etching to remove the second hard mask layer 210 may be reduced, and/or a first hard mask layer 208 may be intact after removing the second hard mask layer 210. Based on the first hard mask layer 208 being intact after removing the second hard mask layer 210, an etching tool may remove a second top portion of the cladding structure 214 and the first hard mask layer 208 without causing damage to a top layer of silicon-based layers 204A that forms a top surface of a nanostructure 204. In this way, the top layer of the silicon-based layers 204A may be substantially planar and/or may extend from a first element of the cladding structure 214 to a second element of the cladding structure 214 and/or may provide a barrier between lower layers of the nanostructure 204 and a material disposed on the top layer of the silicon-based layers 204A, among other things.

As described in greater detail above, some implementations described herein provide a method of forming a semiconductor device. The method includes forming a nanostructure having a first set of layers of a first material and a second set of layers, alternating with the first set of layers, having a second material. The method also includes depositing a hard mask on a top layer of the first set of layers, the hard mask including a first hard mask layer on the top layer of the first set of layers and a second hard mask layer on the first hard mask layer. The method further includes depositing elements of a cladding structure on sidewalls of the nanostructure and the hard mask. The method additionally includes removing a top portion of the cladding structure. The method further includes removing the second hard mask layer after removing the top portion of the cladding structure.

As described in greater detail above, some implementations described herein provide a method of forming a semiconductor device. The method includes forming a nanostructure having a top surface at a first height. The method also includes forming a cladding structure having a top surface at a second height, the nanostructure disposed between elements of the cladding structure. Forming the cladding structure having the top surface at the second height comprises: forming a hard mask on the nanostructure, forming the cladding structure on sidewalls of the nanostructure and sidewalls of the hard mask, removing a first top portion of the cladding structure, removing the hard mask after removing the first top portion of the cladding structure, and removing a second top portion of the cladding structure after removing the hard mask. The top surface of the nanostructure comprises a silicon-based structure having a substantially planar top surface that extends from a first element of the elements of the cladding structure to a second element of the elements of the cladding structure.

As described in greater detail above, some implementations described herein provide a method of forming a semiconductor device. The method includes depositing a first hard mask layer on a nanostructure. The method also includes depositing a second hard mask layer on the first hard mask layer. The method further includes depositing elements of a cladding structure on sidewalls of the nanostructure, the first hard mask layer, and the second hard mask layer. The method additionally includes depositing material on a top surface of the second hard mask layer and the cladding structure. The method of further includes performing a planarization operation on a top surface of the semiconductor device to remove the material from the top surface of the cladding structure and a top surface of the second hard mask layer. The method also includes removing, after performing the planarization operation, a first top portion of the cladding structure. The method additionally includes removing the second hard mask layer after removing the first top portion of the cladding structure. The method further includes removing, after removing the second hard mask layer, a second top portion of the cladding structure and the first hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a nanostructure having a first set of layers of a first material and a second set of layers, alternating with the first set of layers, having a second material;
   depositing a hard mask on a top layer of the first set of layers, the hard mask including a first hard mask layer on the top layer of the first set of layers and a second hard mask layer on the first hard mask layer;
   depositing elements of a cladding structure, comprising a silicon germanium-based material, on sidewalls of the nanostructure and the hard mask;
   removing a top portion of the cladding structure; and
   removing the second hard mask layer after removing the top portion of the cladding structure.

2. The method of claim 1, further comprising:
   depositing, after depositing the hard mask and before removing the top portion of the cladding structure, a dielectric structure on a top surface of the elements of the cladding structure and on a top surface of the hard mask; and
   performing a planarization operation to remove the dielectric structure from the top surface of the elements of the cladding structure and from the top surface of the hard mask.

3. The method of claim 2, wherein the planarization operation is configured to cease based on reaching the first hard mask layer.

4. The method of claim 1, wherein, after removing the top portion of the cladding structure, a distance between a top surface of the cladding structure and a topmost surface of the second hard mask layer is in a range of approximately 12 nanometers to approximately 16 nanometers.

5. The method of claim 1, wherein, after removing the top portion of the cladding structure, a distance between a top surface of the cladding structure and a topmost surface of the second hard mask layer is in a range of approximately one-half to two-thirds of a thickness of the second hard mask layer before etching the top portion of the cladding structure.

6. The method of claim 1, wherein the first hard mask layer has a thickness in a range of approximately 2 nanometers to approximately 8 nanometers.

7. The method of claim 1, wherein the first set of layers comprise channels of the nanostructure.

8. The method of claim 1, further comprising:
   removing, after removing the second hard mask layer, an additional portion of the cladding structure that extends above a top surface of the top layer of the first set of layers; and
   removing the first hard mask layer.

9. The method of claim 8, wherein the cladding structure and the first hard mask layer are formed of a same material, and
   wherein removing the additional portion of the cladding structure and removing the first hard mask layer comprise a single etching operation that is configured for selective etching of the same material.

10. The method of claim 8, further comprising:
    performing, after removing the additional portion of the cladding structure and removing the first hard mask layer, a cleaning operation on the cladding structure.

11. The method of claim 1, wherein the first hard mask layer is configured as an etch stop layer for an etching operation associated with removing the second hard mask layer.

12. A method of forming a semiconductor device, comprising:
    forming a nanostructure having a top surface at a first height, and
    forming a cladding structure having a top surface at a second height that is is approximately equal to or less than the first height, the nanostructure disposed between elements of the cladding structure,
    wherein forming the cladding structure having the top surface at the second height comprises:
      forming a hard mask on the nanostructure,
      forming the cladding structure on sidewalls of the nanostructure and sidewalls of the hard mask,
      removing a first top portion of the cladding structure,
      removing the hard mask after removing the first top portion of the cladding structure, and
      removing a second top portion of the cladding structure after removing the hard mask, and
    wherein the top surface of the nanostructure comprises a silicon-based structure having a substantially planar top surface that extends from a first element of the elements of the cladding structure to a second element of the elements of the cladding structure.

13. The method of claim 12, wherein the top surface of the nanostructure is free of material of a first hard mask layer and material of a second hard mask layer.

14. The method of claim 12, wherein the cladding structure comprises a silicon germanium-based material.

15. The method of claim 14, wherein the silicon germanium-based material has a concentration of germanium in a range of approximately 18% to approximately 30%.

16. A method of forming a semiconductor device, comprising:
depositing a first hard mask layer on a nanostructure;
depositing a second hard mask layer on the first hard mask layer;
depositing elements of a cladding structure on sidewalls of the nanostructure, the first hard mask layer, and the second hard mask layer;
depositing material on a top surface of the second hard mask layer and the cladding structure;
performing a planarization operation on a top surface of the semiconductor device to remove the material from the top surface of the cladding structure and a top surface of the second hard mask layer;
removing, after performing the planarization operation, a first top portion of the cladding structure;
removing the second hard mask layer after removing the first top portion of the cladding structure; and
removing, after removing the second hard mask layer, a second top portion of the cladding structure and the first hard mask layer.

17. The method of claim 16, wherein removing the first top portion of the cladding structure comprises:
performing a wet etching process to remove the first top portion of the cladding structure.

18. The method of claim 17, wherein performing the wet etching process comprises applying a fluid with high selectivity for removing material of the cladding structure.

19. The method of claim 12, wherein the nanostructure has a first set of layers of a first material and a second set of layers, alternating with the first set of layers, having a second material, and
wherein the hard mask is formed on a top layer of the first set of layers.

20. The method of claim 19, wherein the hard mask includes a first hard mask layer on the top layer of the first set of layers and a second hard mask layer on the first hard mask layer.

* * * * *